United States Patent
Deliwala

(10) Patent No.: US 8,542,965 B2
(45) Date of Patent: Sep. 24, 2013

(54) BIDIRECTIONAL OPTICAL LINK OVER A SINGLE MULTIMODE FIBER OR WAVEGUIDE

(75) Inventor: Shrenik Deliwala, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 345 days.

(21) Appl. No.: 12/711,733

(22) Filed: Feb. 24, 2010

(65) Prior Publication Data

US 2010/0284699 A1   Nov. 11, 2010

Related U.S. Application Data

(63) Continuation of application No. 11/958,626, filed on Dec. 18, 2007, now Pat. No. 7,693,373.

(51) Int. Cl.
*G02B 6/26* (2006.01)

(52) U.S. Cl.
USPC .............................. 385/43; 385/28

(58) Field of Classification Search
USPC ..................................... 385/43, 28
See application file for complete search history.

(56) References Cited

U.S. PATENT DOCUMENTS

| | | | | |
|---|---|---|---|---|
| 4,822,128 A * | 4/1989 | Imoto et al. ..................... 385/43 |
| 4,877,300 A | 10/1989 | Newhouse et al. |
| 5,050,952 A * | 9/1991 | FussgaKurt ...................... 398/44 |
| 5,138,676 A * | 8/1992 | Stowe et al. ..................... 385/32 |
| 5,295,219 A * | 3/1994 | Koya et al. ..................... 385/134 |
| 5,416,862 A | 5/1995 | Haas et al. |
| 5,457,760 A * | 10/1995 | Mizrahi ........................... 385/37 |
| 5,463,705 A * | 10/1995 | Clauberg et al. ................ 385/14 |
| 5,600,433 A * | 2/1997 | Buttry et al. ................... 356/128 |
| 6,008,675 A | 12/1999 | Handa |
| 6,169,830 B1 * | 1/2001 | Kewitsch et al. ................ 385/37 |
| 6,310,995 B1 * | 10/2001 | Saini et al. ..................... 385/28 |
| 6,377,726 B1 | 4/2002 | Danziger et al. |
| 6,430,207 B1 * | 8/2002 | Alphonse ........................ 372/98 |
| 6,445,851 B1 * | 9/2002 | Rakuljic et al. ................ 385/37 |
| 6,465,153 B1 * | 10/2002 | Kewitsch et al. ............. 430/290 |
| 6,567,583 B2 | 5/2003 | Mettler et al. |
| 6,580,850 B1 * | 6/2003 | Kazarinov et al. ............. 385/28 |
| 6,633,696 B1 * | 10/2003 | Vahala et al. ................... 385/27 |

(Continued)

FOREIGN PATENT DOCUMENTS

EP    1041409 A    10/2000
EP    1245973      10/2002

(Continued)

OTHER PUBLICATIONS

Stuart, "Dispersive multiplexing in multimode fiber" ThV2-1/305-307, Jul. 2000.

(Continued)

*Primary Examiner* — Kaveh Kianni
(74) *Attorney, Agent, or Firm* — Knobbe Martens Olson & Bear LLP

(57) ABSTRACT

A transceiver for use in a bidirectional optical communication link over a multimode channel is provided. The transceiver includes a single transverse mode light source in a transmitter. A waveguide or fiber based bidirectional coupler projects the transmitter mode to the high modes of the multimode channel. A detector coupled to predominantly all the modes of the channel via the waveguide or fiber based bidirectional coupler.

10 Claims, 8 Drawing Sheets

(56) References Cited

U.S. PATENT DOCUMENTS

| | | | |
|---|---|---|---|
| 6,677,576 B1* | 1/2004 | Kenny et al. | 250/227.14 |
| 6,763,685 B1* | 7/2004 | Gonthier | 65/411 |
| 6,868,222 B2* | 3/2005 | DePue et al. | 385/140 |
| 6,870,987 B2* | 3/2005 | Lee | 385/28 |
| 6,891,996 B2* | 5/2005 | Sercel et al. | 385/30 |
| 6,894,828 B2* | 5/2005 | Pelouch et al. | 359/333 |
| 7,082,235 B2* | 7/2006 | Gunn, III | 385/28 |
| 7,106,917 B2* | 9/2006 | Painter et al. | 385/2 |
| 7,190,852 B2* | 3/2007 | Heim et al. | 385/14 |
| 7,194,156 B2 | 3/2007 | Deliwala | |
| 7,212,712 B2* | 5/2007 | Ramadan | 385/50 |
| 7,317,853 B2* | 1/2008 | Laurent-Lund et al. | 385/43 |
| 7,386,213 B2* | 6/2008 | Shimizu et al. | 385/129 |
| 7,415,175 B2 | 8/2008 | Deliwala | |
| 2003/0007535 A1* | 1/2003 | Haase et al. | 372/50 |
| 2003/0021302 A1* | 1/2003 | Grudinin et al. | 372/6 |
| 2003/0081902 A1* | 5/2003 | Blauvelt et al. | 385/50 |
| 2003/0133661 A1 | 7/2003 | Adibi et al. | |
| 2003/0210725 A1* | 11/2003 | Prassas et al. | 372/50 |
| 2004/0001687 A1* | 1/2004 | DePue et al. | 385/140 |
| 2004/0008405 A1* | 1/2004 | Pelouch et al. | 359/341.3 |
| 2004/0033021 A1* | 2/2004 | Oguri et al. | 385/37 |
| 2004/0037497 A1* | 2/2004 | Lee | 385/28 |
| 2004/0105644 A1* | 6/2004 | Dawes | 385/129 |
| 2004/0208447 A1* | 10/2004 | Ramadan | 385/50 |
| 2005/0213889 A1* | 9/2005 | Blauvelt et al. | 385/50 |
| 2006/0204175 A1* | 9/2006 | Laurent-Lund et al. | 385/43 |
| 2007/0025671 A1* | 2/2007 | Shimizu et al. | 385/129 |

FOREIGN PATENT DOCUMENTS

| | | |
|---|---|---|
| EP | 1460785 | 9/2004 |
| JP | 2000-314818 | 11/2000 |
| WO | WO-00/41016 A1 | 7/2000 |
| WO | WO-02/27371 | 4/2002 |
| WO | WO-2007/035866 A1 | 3/2007 |

OTHER PUBLICATIONS

Haas et al., "A Mode-Filtering Scheme for Improvement of the Bandwith-Distance Product in Multimode Fiber Systems" Journal of Lightwave Technology, vol. 11, No. 7, Jul. 1993; 1125-1131.

Papen et al., "Modal Noise in Multimode Fibers under Restricted Launch Conditions" Journal of Lightwave Technology, vol. 17, No. 5, May 1999, 817-822.

Saijonmaa et al., "Selective excitation of parabolic-index optical fibers by Gaussian Beams" Applied Optics, vol. 19, No. 14, Jul. 1980, 2442-2451.

Johnson et al., "Light Coupling by a Vortex Lens into Graded Index Fiber" Journal of Lightwave Technology, vol. 19, No. 5, May 2001, 753-758.

Argon et al., "Exploiting Diversity in Multimode Fiber Communications Links, Via Multisegment Detectors and Equalization" IEEE Communications Letters, vol. 7, No. 8 Aug. 2003, 400-402.

Patel et al., "Enhanced Multimode Fiber Link Performance Using a Spatially Resolved Receiver" IEEE Photonics Technology Letters, vol. 14, No. 3 Mar. 2002, 393-395.

Raddatz et al., "An Experimental and Theoretical Study of the Offset Launch Technique for the Enhancement of the Bandwith of Multimode Fiber Links" Journal of Lightwave Technology, vol. 16, No. 3, Mar. 1998, 324-331.

Saijonmaa et al., "Reduction of modal noise by using reduced spot excitation" Applied Optics, vol. 20, No. 24, Dec. 1981, 4302-4305.

Webster et al., "A Statistical Analysis of Conditioned Launch for Gigabit Ethernet Links Using Multimode Fiber" Journal of Lightwave Technology, vol. 17, No. 9, Sep. 1999, 1532-1541.

Severin et al., "Differential Mode Loss and Mode Conversion in Passive Fiber Components Measures Using the Chromatic Launching and the Central Spot Far Field Techniques" Journal of Lightwave Technology, vol. LT-4, No. 11, Nov. 1986, 1640-1646.

* cited by examiner

BIDIRECTIONAL OPTICAL LINK OVER A SINGLE MULTIMODE FIBER OR WAVEGUIDE

BACKGROUND OF THE INVENTION

The invention relates to the field of multimode fibers, and in particular to bidirectional optical link over a single multimode fiber or waveguide.

Most optical links are point-to-point links. The present practice is to have two fibers—one for transmission and the other for reception of light. Two fibers are used to primarily avoid any coupling of two lasers on the two sides of the link. It is possible to construct a bidirectional link over the same fiber without making lasers unstable if "uplink" used a different wavelength then "downlink". Now it is possible to use a simple 3 dB beam splitter at each end. Because the wavelengths are different, the lasers do not couple and hence the link is made. In this case, there will be 6 db (3 dB each end) insertion loss from the beam splitters. This may not be a problem if there is sufficient transmit laser power and receiver sensitivity.

The 6 dB link loss is significant if the light is either traveling long distances or in case of high speed links when there is often insufficient link margin. In this case wavelength separation optics at each end can efficiently separate the colors to provide low loss link for each direction. This is well known and implemented in large volume in Passive Area Networks (PONS) by telecomm companies. Wavelength separation optics generally adds cost. This stems from (1) use of wavelength separation optics such as filters, gratings etc. (2) higher alignment requirements, (3) more complex testing and assembly, (4) inventory of at least two different wavelength transmitters, or the like.

Even if a clever transceiver design overcomes the various hurdles mentioned above, one still has a logistical challenge. Transceivers have to be labeled—say Red and Blue corresponding to the different wavelengths of the lasers. The two ends of the bidirectional link over a same fiber must have Red and Blue transceiver at each end. This is a real market challenge. Imagine that optical links are used for high speed television data such as HDMI links. Now in this case one may decide that all DVD players carry Blue transceivers and all TV's carry Red transceivers. This may be OK until a receiver is inserted between TV and DVD player. Now one may have to explicitly label Red ports for reception and Blue ports for transmission. If a TV manufacturer decides that the TV may be used to connect a home video camera to the DVD recorder and another auxiliary display, suddenly the TV must carry Red transceivers too.

One might overcome some of the above limitations of using wavelength multiplexing by using the same wavelength lasers at both ends and insert attenuators in the link such that it maintains the link but provides sufficiently high insertion loss to not make the lasers unstable. This is a not a very robust solution since lasers are high gain devices and it is hard to maintain precise attenuation while maintaining adequate link margin. Only a very carefully constructed laser coupling (with precision alignment requirement) and fixed length links with "factory-set" attenuation tweaked for each link at manufacturing might work. This means that it is difficult to imagine links constructed with multimode fibers and customer made patch cords in the field.

SUMMARY OF THE INVENTION

According to one aspect of the invention, there is provided a bidirectional optical communication link over a multimode channel that includes at least two similarly configured transceivers. Each of the at least two transceivers include a single transverse mode light source in a transmitter. A waveguide or fiber based bidirectional coupler projects the transmitter mode to the high modes of the multimode channel. A detector coupled to predominantly all the modes of the channel via the waveguide or fiber based bidirectional coupler.

According to another aspect of the invention, there is provided a transceiver for use in a bidirectional optical communication link over a multimode channel. The transceiver includes a single transverse mode light source in a transmitter. A waveguide or fiber based bidirectional coupler projects the transmitter mode to the high modes of the multimode channel. A detector coupled to predominantly all the modes of the channel via the waveguide or fiber based bidirectional coupler.

According to another aspect of the invention, there is provided a method of forming a transceiver for use in a bidirectional optical communication link over a multimode channel. The method includes providing a single transverse mode light source in a transmitter. Also, the method includes forming a waveguide or fiber based bidirectional coupler projecting the transmitter mode to the high modes of the multimode channel. Furthermore, the method includes forming a detector coupled to predominantly all the modes of the channel via the waveguide or fiber based bidirectional coupler.

According to yet another aspect of the invention, there is provided a method of performing bidirectional optical communication link operations over a multimode channel. The method includes providing a single transverse mode light source in a transmitter. Also, the method includes projecting the transmitter mode to the high modes of the multimode channel. Furthermore, the method includes detecting predominantly all the modes of the multimode channel via the waveguide or fiber based bidirectional coupler.

DETAILED DESCRIPTION OF THE INVENTION

The present invention provides the capacity for coupling a laser from transmitter A to Receiver B on the other side with very low loss while simultaneously providing very high loss to the Transmitter B (>40 dB) to unconditionally maintain stability of both the lasers. This is achieved either inside or near each of the transceivers. For the end user, a standard single optical connector is presented. All transmitters and receivers are identical. There is no stringent requirement on the optical fiber inserted between the transceiver by the user. The same fiber used today with connectors will work with the invention.

Figure 1:
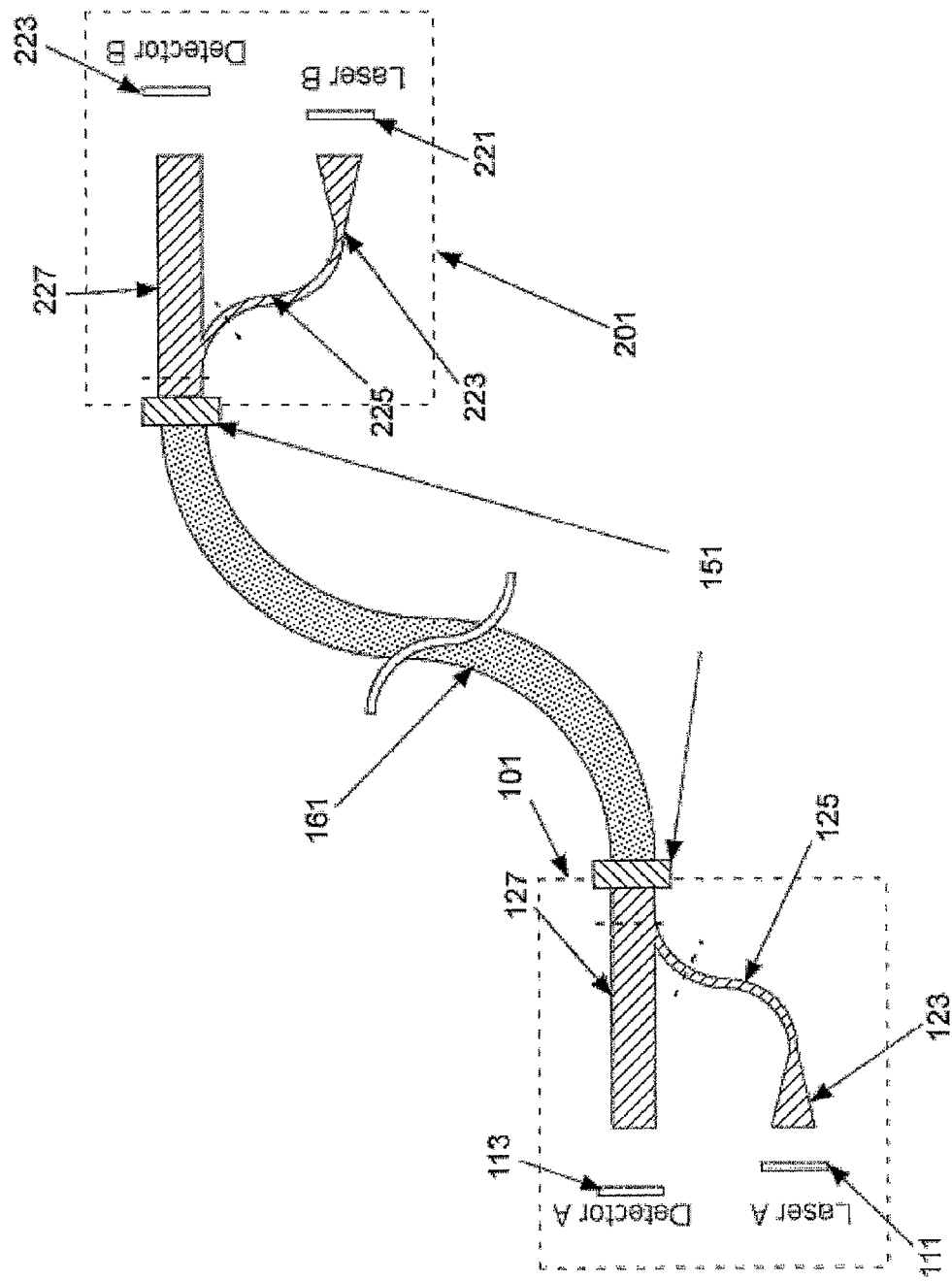
FIG. 1 is a schematic diagram illustrating bidirectional optical link over a single multimode fiber or waveguide in accordance with the invention.

The object and advantages mentioned above in the present invention are achieved by using asymmetric mode-coupling in multimode fibers. In short, a single transverse mode laser (edge emitter or a single mode VCSEL) is coupled to a multimode fiber. This multimoded section is tapered so as to allow a single mode transmission. This single mode is coupled to a multimode fiber link in such a way so as to excite high order modes. These high order modes couple poorly back to a similar single mode to multimode taper at the other end of the link. Furthermore, even if some light makes it past the single mode selector, the output would be a fundamental mode of the fiber, which will couple poorly to the small aperture single transverse mode laser. This is shown in FIG. 1.

Transceiver 101 is identical transceiver 201. They are connected by a multimode fiber (MMF) 161 of some length. 151 are connectors that allow the transceivers and the fiber 161 to be connected. The MMF 161 carries data in both directions— from Laser A 111 to Detector B 223 in one direction and from Laser B 221 to Detector B 113 in the other direction. The laser-to-detector link has very low loss giving a good link but laser-to-laser coupling is extremely weak.

First consider launching of laser light in to the fiber. This consists of using large area multimode coupler 123. One can use the simplest technique of coupling light from the laser— allow the laser beam to expand until its beam size approximately matches the input mode of the taper 123. Depending on the size of the input mode of the taper, more than 50% of the laser light can be coupled. For example, with an input face size of 62.5×62.5 micron, greater than 70% of the light from a single mode VCSEL (SMVCSEL) can be coupled. The laser light primarily excites the fundamental mode of the taper. Any higher order excitations are filtered out as the other end of the taper ends into waveguide/fiber section 125 which is only capable of carrying only the fundamental mode. The core diameter of 125 is thus much smaller and will depend on the index contrast. This fundamental mode is directly injected into the main waveguide/fiber of cross-section as this section 125 is fused to the main section 127. The multimode section 127 is then matched to the MMF 161. The entire region 123, 125, and 127 may be considered a bidirectional coupler 103. In general the modes of the section 125 are different than the modes of the fiber 161 which further mixes the modes.

Figure 2:
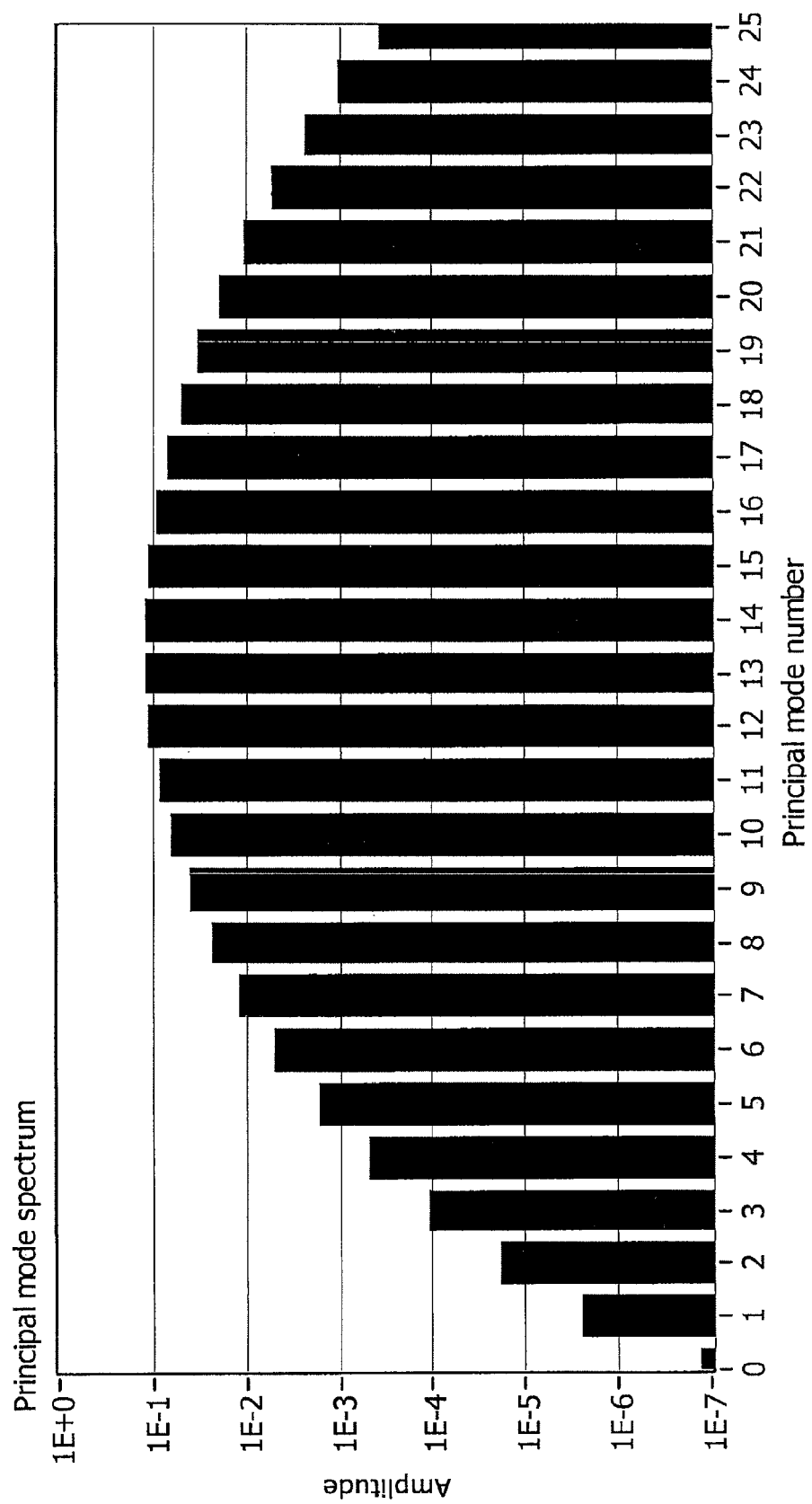
FIG. 2 is a graph demonstrating the distribution of the principal mode numbers for a gradient index 62.5 micron fiber.

Thus, most of the laser light is coupled in to the main fiber 161. Simulations suggest that 20% to 70% of the light can be coupled to the MMF 161 from the laser 111 depending on the laser type and the opto-mechanical assembly. This is comparable to the laser coupling efficiencies in the commercially available transceivers. Some of the popular core diameters of the MMF fibers 161 are 50 μm, 62.5 μm, and 120 μm. Since this mode is injected from the side of the multimode section 127, it predominantly excites the higher order modes of the section 127 and also of MMF 161. These higher modes arrive on the other side. The distribution of the principal mode numbers for a gradient index 62.5 micron fiber is shown in FIG. 2.

Since the relative phases of each of the principal mode numbers are essentially randomized at the other end of the fiber (from mode-mixing within each of the principal numbers as well as mixing between principal numbers due to various connectors along the path), one can compute the statistical probability that some light couples via section 225 and travels towards the laser 221.

Figure 3:
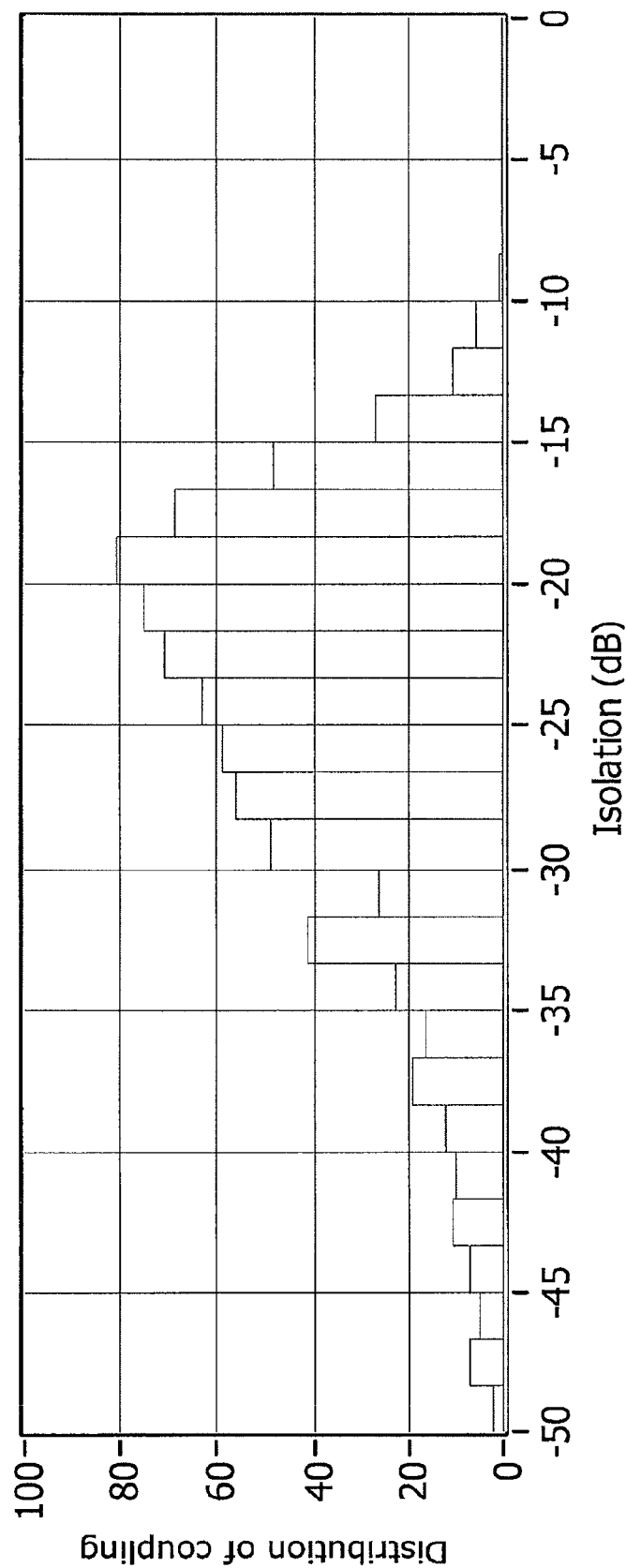
FIG. 3 is a graph demonstrating the histogram of expected coupling efficiency of fibers used in accordance with the invention.

FIG. 3 shows the histogram of expected coupling efficiency into the section 225. This computation ignores effect of connectors, the effect of mode mixing resulting from use of different types of waveguides 127 and 161, and attenuation along the fiber. One can make a simple assumption that the same principle mode distribution appears at the far-end but with phases randomized by the time light reaches the other end of the link. Even in this case, one can see that <20 dB of light is coupled into the section 225. From the earlier remark, it follows that this histogram represents a fairly conservative estimate of light coupling. In practice, the coupling is likely to be even smaller due to attenuation of some of the higher order modes and effect of connectors and differences in the mode spectrum of waveguide based section in 127 and the modes of the fiber 161.

There is further attenuation of the light coming from the far-end, before it is coupled to the laser. This is because only the fundamental mode of 225 is transmitted towards the laser. Taper 223 now expands this small fraction of the light to the fundamental mode whose size is of the order of the input/output face of 223. This mode, due to its relatively large size, is essentially collimated and travels towards the laser B 221 whose aperture is significantly smaller than the output face of 223. Thus, only a small fraction of the light emerging from 223 is actually coupled to the laser. One can now estimate this second attenuation in coupling.

Let R be the effective radius of the fundamental mode of the taper 123 or 223, which one can model as having a Gaussian intensity distribution, $$I_{taper} = \exp\left(-\frac{r^2}{2R^2}\right).$$  EQ. 1

The laser may be modeled as having an aperture α<<R. In our example, R may be near 50-120 microns while α is close to 3 microns for a SMVCSEL or 1×0.2 micron for an edge emitter. Since the laser is placed within 0.5 mm of the input/output face of 223, the fundamental mode may be assumed to remain collimated as it travels towards the laser. Of course one can substitute for R, the effective Gaussian diameter at the laser. The overlap integral is then given by, $$\eta = 2\left(\frac{aR}{a^2 + R^2}\right)$$  EQ. 2

The above equation gives us approximately—10 dB of coupling from the output face of taper 223 to a SMVCSEL with α≈3 μm, R=62.5 μm.

Figure 4:
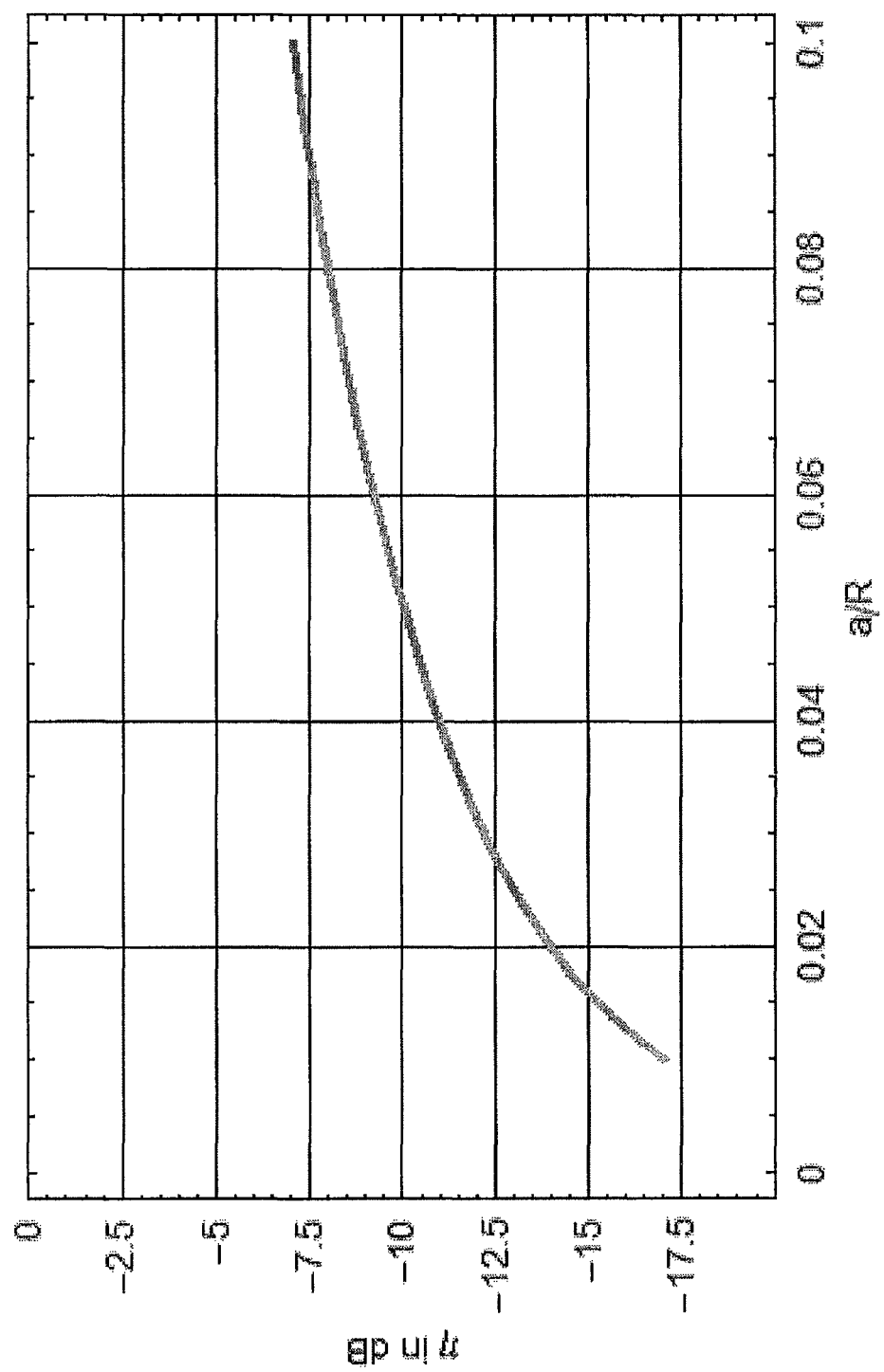
FIG. 4 is a graph demonstrating the coupling efficiency η as a ratio a/R

FIG. 4 shows the coupling efficiency η as a ratio a/R. If any optical elements are inserted between the laser and the input to the coupler, then the attenuation of light from the output of the bidirectional coupler from the far-end laser will need to be computed with the intermediate optics in place. At any rate, use of adiabatic taper or a mode filter gives dual advantages: good coupling from the transmitting laser and poor coupling from the far-end laser.

Thus, the overall coupling to the laser 221 from laser 121 is a product of coupling from the MM section 227 to 225 and from the output face of 225 to the laser 221. This product turns out to be less than −30 dB and as little as −60 dB. Even using the worse case result of −30 dB, one can provide for low coupling from laser 111 to laser 221 while simultaneously allowing for good coupling between laser and detector of the opposing transceivers.

There are many ways in which to implement the system shown in FIG. 1.

Figure 5:
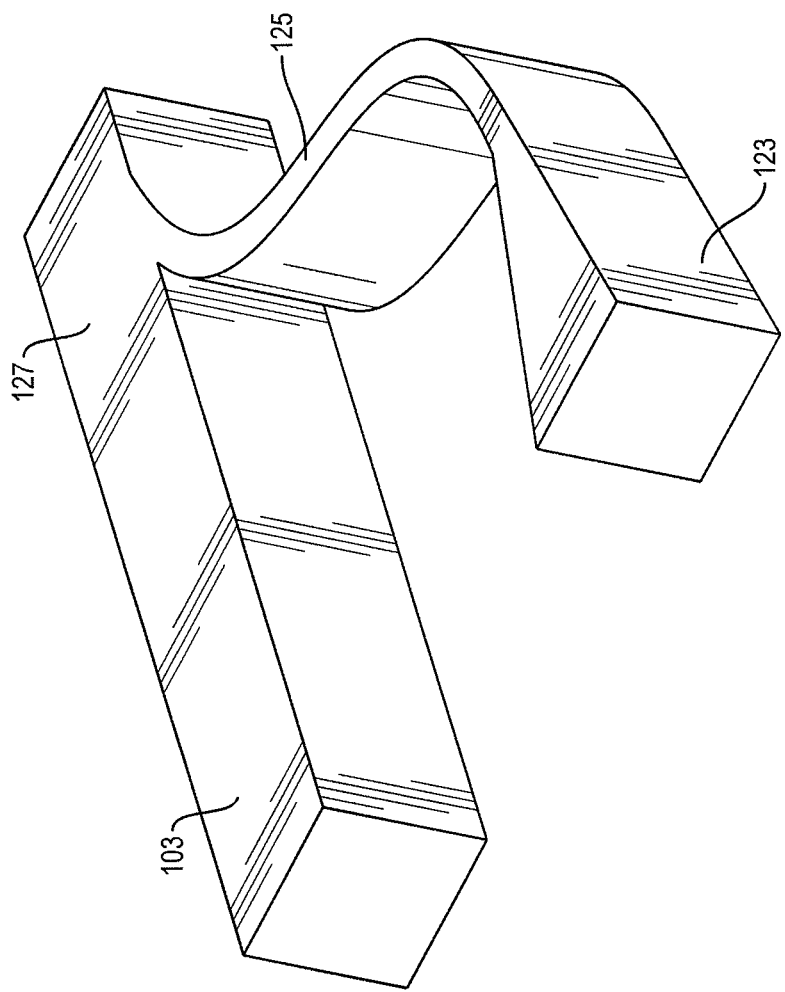
FIG. 5 is a schematic diagram illustrating a 3D perspective of the bidirectional coupler formed in accordance with the invention.

FIG. 5 shows the region 127, 123, and 125 in 3D perspective. In this case, SM condition of 125 is achieved only in horizontal dimension while it remains multi-moded in the vertical dimension or in the plane perpendicular to the plane of waveguides. This reduces the isolation as more light from the multimode section 127 will couple back via the section 125 when incident from the other transceiver 201. Detailed simulations suggest that the actual isolation does not change significantly. This is because higher modes are excited of the fiber 161. Even when some of the "vertical" projection of these higher modes leaks past the section 125 (when incident from the other transceiver), they produce a small electric field at the center of the plane where single mode laser is present. This follows from the fact that the higher order modes have low intensity in the center.

Figure 6:
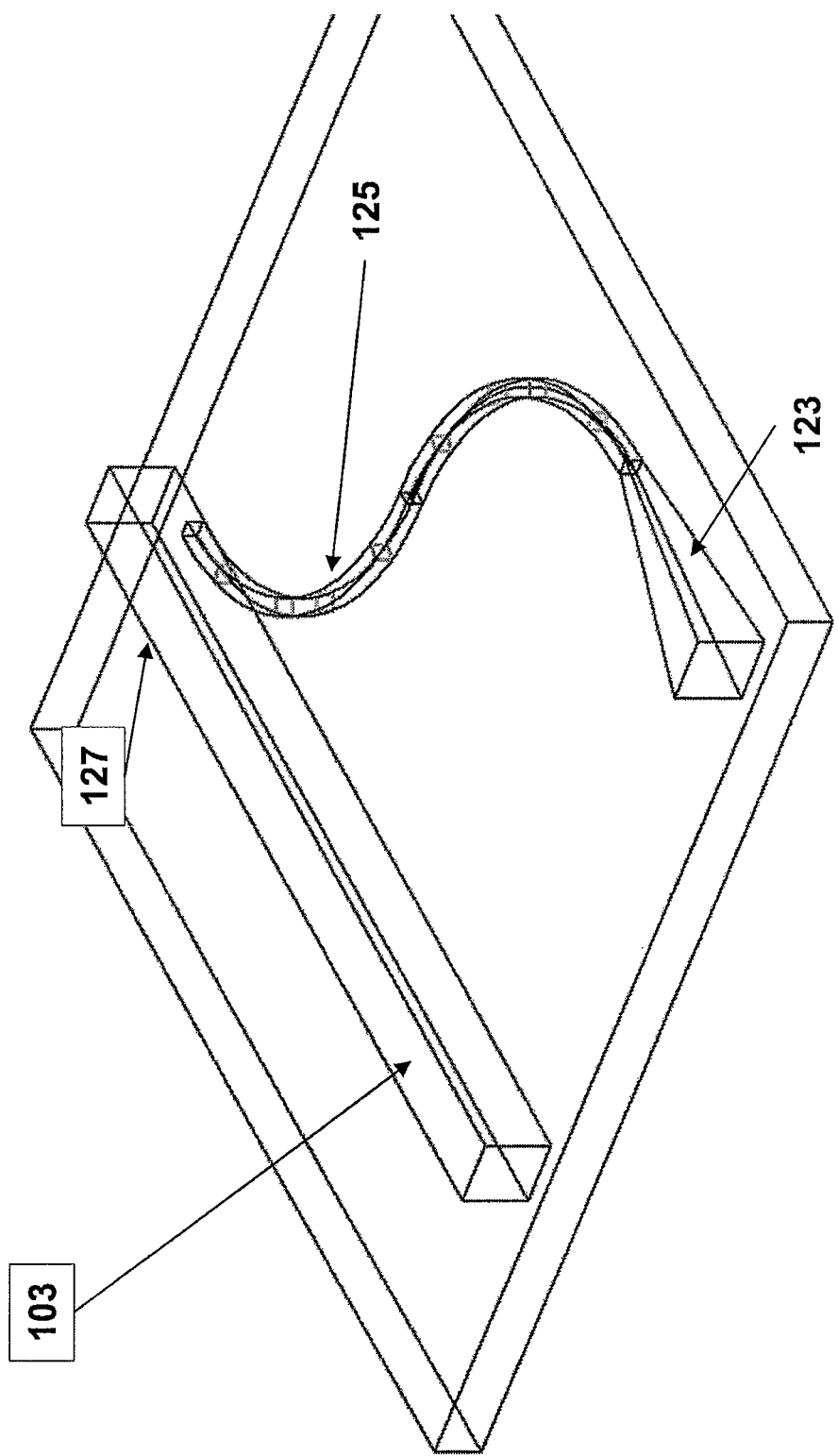
FIG. 6 is a schematic diagram illustrating a 3D perspective of the taper used in the bidirectional coupler formed in accordance with the invention.

A 3D taper is shown in FIG. 6. In this case region 125 is a true single mode region. This case produces better isolation. One can use fusion splicing of tapered MMF with normal MMF: The MMF taper is used to allow for a single mode transmission. In this case, this taper is joined to the MM section and used to excite higher order modes.

Figure 7:
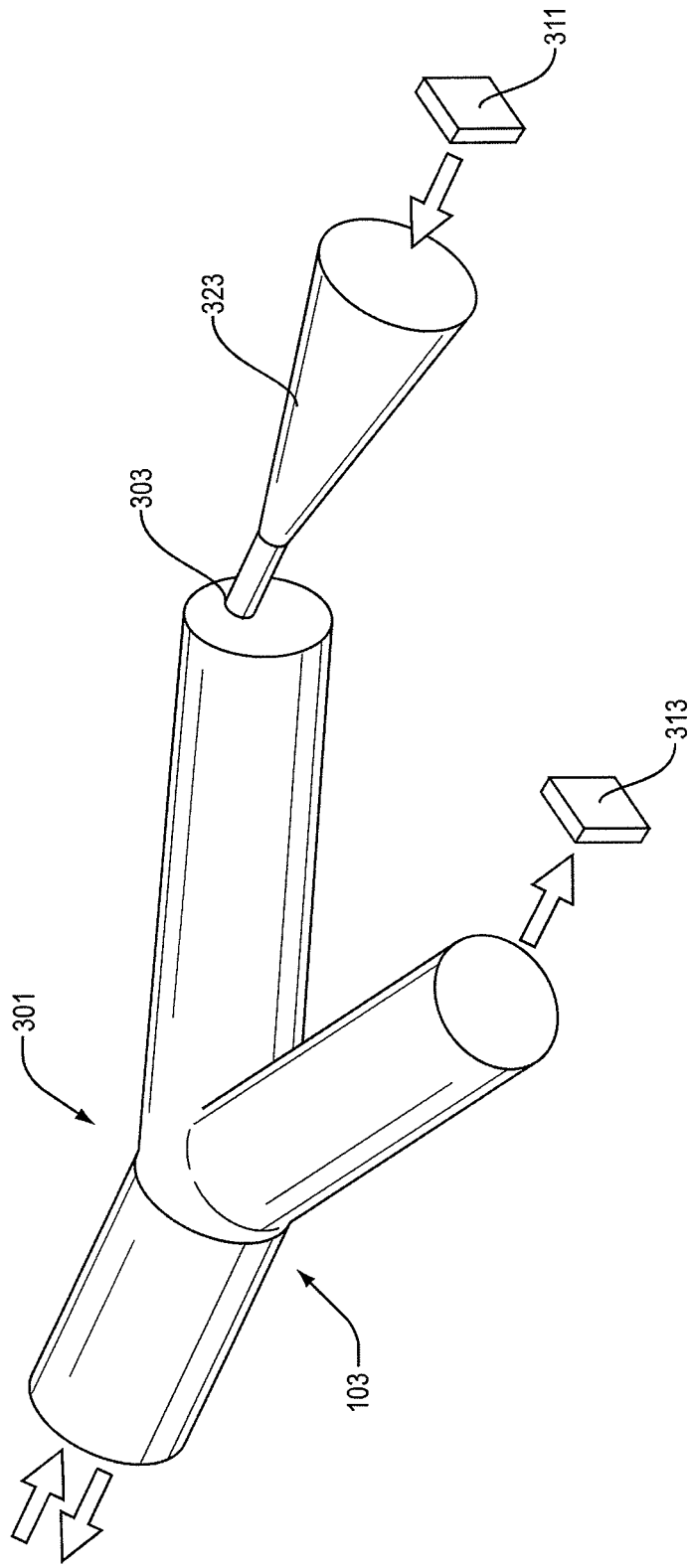
FIG. 7 is a schematic diagram illustrating a mode filter in conjunction with offset launch into a multimode fiber used in accordance with the invention.

FIG. 7 shows using a mode filter in conjunction with offset launch into a multimode fiber and 3-dB fiber splitters. The laser light is incident from the direction of laser 311 and is passed through a mode filter or an adiabatic taper 323 as shown in earlier patent applications. The single mode transmission from 323 is then made incident on one of the arms of the Y-splitter 301 with an offset from the center as shown by 303. This offset causes excitation of the higher order modes of the fiber. The principal mode spectrum is similar to the one shown in FIG. 2.

These modes are then sent towards other transmitter. The modes coming from the other transmitter are split by the splitter (3 dB splitting loss) and sent towards both the detector 313 and laser 311. Since the modes arriving from the other transmitter carry their energy in predominantly high principal numbers, they have a very small overlap with the single mode section near 303 of the mode filter 323. Hence very little power from the other laser is transmitted towards the laser 311. Nevertheless, a small fraction of light transmitted by 323 arriving from the other transmitter creates the excitation of only the fundamental mode of the 323 at the output/input interface. This large mode has a small overlap with the laser mode and thus coupling of the far-end laser to the laser 311 is reduced to negligible levels. Thus, a high loss is again achieved to the laser of the far-end transmitter but a much lower loss path (≦6 dB) to the far-end detector. This solution is not as ideal as the other options, due to loss of power at the combiner, but can be readily implemented on commercially available transceivers by use of various specialty patch cords.

Figure 8:
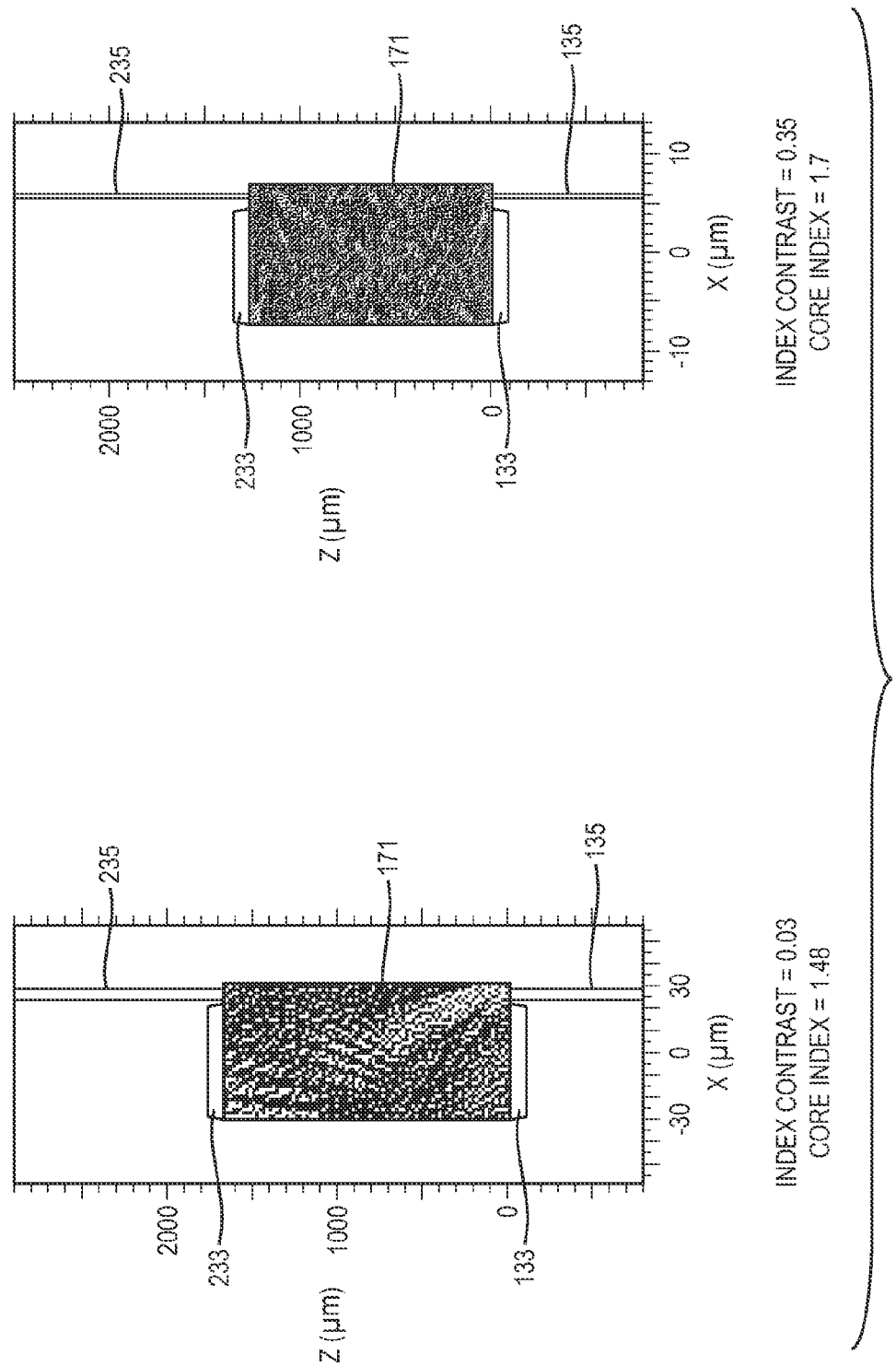
FIG. 8 is a schematic diagram illustrating bidirectional links being achieved using pure slab waveguides in accordance with the invention.

The bidirectional links may be achieved using pure slab waveguides. This may be particularly on an optical integrated circuit. A simple implementation is shown in FIG. 8 for cases of a low-index contrast as well as high index contrast waveguides. One can choose the waveguide parameters in such a way so as to reduce the coupling between the single mode lasers fed by a single mode waveguide to the multimode slab waveguide 171. The width of waveguide 171 width can be selected to minimize the coupling to the lasers via waveguides 135 and 235 which have a fixed distance between them. This is because the slab waveguide 171 (taking the role of MMF 161) acts like a multimode interference device in which the input gets periodically imaged, as shown in FIG. 8.

Waveguide 135 carries the input light to the slab waveguide 171 from one direction. The wave propagation in the waveguide results in a null of the electric field at the input of the other waveguide 235 and thus little light from 135 is coupled to 235. At the same time, detector 233 can collect all the light in the waveguide 171 transmitted from 135. Similarly detector 133 will collect all the light from waveguide 235. In each of the cases above, laser to laser coupling can be reduced to less than −40 dB.

Although the present invention has been shown and described with respect to several preferred embodiments thereof, various changes, omissions and additions to the form and detail thereof, may be made therein, without departing from the spirit and scope of the invention.

What is claimed is:

1. A system for bidirectional optical communication over a multi mode channel, the system comprising:
at least two transceivers on opposing ends of the multi mode channel, each of the transceivers comprising:
a single transverse mode light source in a transmitter;
a bidirectional coupler that projects the single transverse mode to higher order modes of the multi mode channel; and
a detector in a receiver, the detector coupled to modes of the multi mode channel via the bidirectional coupler,
wherein the bidirectional coupler comprises an optical splitter in which one branch is connected to the transmitter and the other branch is connected to the receiver, the optical splitter configured to couple substantially more light from the multi mode channel to the detector than to the transmitter.

2. The system of claim 1, wherein at least one of the bidirectional couplers comprises an adiabatically tapered section that transmits the single transverse mode to a region that projects the single transverse mode to the higher order modes of the multi mode channel.

3. The system of claim 1, wherein at least one of the bidirectional couplers comprises polymer waveguides/fibers.

4. The system of claim 1, wherein at least one of the bidirectional couplers comprises glass waveguides/fibers.

5. The system of claim 1, wherein the optical splitter is configured such that overall coupling of light from the transmitter of a first transceiver to the transmitter of a second transceiver is less than about −30 dB, while overall coupling of light from the transmitter of the first transceiver to the detector of the second transceiver is greater than about −6 dB.

6. A transceiver for use in bidirectional optical communication over a multi mode channel, the transceiver comprising:
a single transverse mode light source;
a bidirectional coupler that projects the single transverse mode to the higher order modes of the multimode channel to propagate in a first direction along the multi mode channel; and
a detector coupled to modes of the channel via the bidirectional coupler and configured to receive an optical signal propagating in a second direction along the multi mode channel, the second direction opposite to the first direction,
wherein the bidirectional coupler comprises an optical splitter in which one branch is coupled to the light source and the other branch is coupled to the detector, the optical splitter configured to couple substantially more light from the multi mode channel to the detector than to the light source.

7. The transceiver of claim 6, wherein the bidirectional coupler comprises an adiabatically tapered section that transmits the single transverse mode to a region that projects the single transverse mode to the higher order modes of the multi mode channel.

8. The transceiver of claim 6, wherein the bidirectional coupler comprises polymer waveguides/fibers.

9. The transceiver of claim 6, wherein the bidirectional coupler comprises glass waveguides/fibers.

10. The transceiver of claim 6, wherein the optical splitter is configured such that overall coupling of light from the multi mode fiber to the light source is less than about −30 dB, while overall coupling of light from the multi mode fiber to the detector of the second transceiver is greater than about −6 dB.

* * * * *